(12) United States Patent
Jeon et al.

(10) Patent No.: US 9,041,178 B2
(45) Date of Patent: May 26, 2015

(54) SEMICONDUCTOR DEVICE

(71) Applicant: SK hynix Inc., Icheon-si Gyeonggi-do (KR)

(72) Inventors: Seon Kwang Jeon, Icheon-si (KR); Sung Soo Ryu, Seongnam-si (KR); Chang Il Kim, Busan (KR)

(73) Assignee: SK Hynix Inc., Gyeonggi-do (KR)

( * ) Notice: Subject to any disclaimer, the term of this patent is extended or adjusted under 35 U.S.C. 154(b) by 101 days.

(21) Appl. No.: 13/843,786

(22) Filed: Mar. 15, 2013

(65) Prior Publication Data

US 2014/0167280 A1     Jun. 19, 2014

(30) Foreign Application Priority Data

Dec. 18, 2012   (KR) .......................... 10-2012-0148230

(51) Int. Cl.
| | |
|---|---|
| *H01L 23/02* | (2006.01) |
| *H01L 23/48* | (2006.01) |
| *H01L 23/00* | (2006.01) |

(52) U.S. Cl.
CPC .............. *H01L 23/481* (2013.01); *H01L 24/19* (2013.01); *H01L 2224/73204* (2013.01)

(58) Field of Classification Search
USPC ......................................... 257/686, 706, 774
See application file for complete search history.

(56) References Cited

U.S. PATENT DOCUMENTS

| 7,369,410 | B2 * | 5/2008 | Chen et al. ..................... 361/701 |
|---|---|---|---|
| 2011/0304038 | A1 * | 12/2011 | Lee .................................. 257/698 |
| 2012/0098114 | A1 * | 4/2012 | Ishibashi ......................... 257/686 |
| 2013/0099368 | A1 * | 4/2013 | Han ................................ 257/692 |
| 2013/0252383 | A1 * | 9/2013 | Chen .............................. 438/127 |

FOREIGN PATENT DOCUMENTS

KR        1020120032254 A      5/2012

\* cited by examiner

*Primary Examiner* — David Vu
*Assistant Examiner* — Brandon Fox
(74) *Attorney, Agent, or Firm* — William Park & Associates Ltd.

(57) ABSTRACT

A semiconductor device including a chip stack structure having a plurality of semiconductor chips, the semiconductor chips being stacked such that they are electrically connected using through-electrodes, and a support frame attached to a side surface of the chip stack structure.

14 Claims, 9 Drawing Sheets

SEMICONDUCTOR DEVICE

CROSS-REFERENCE TO RELATED APPLICATIONS

The present application claims priority to Korean patent application number 10-2012-0148230 filed on Dec. 18, 2012, in the Korean Intellectual Property Office, which is incorporated herein by reference in its entirety.

BACKGROUND

1. Technical Field

The present invention generally relates to a semiconductor device, and more particularly, to a semiconductor device having semiconductor chips, which are stacked using through-electrodes.

2. Related Art

Packaging technologies for a semiconductor device have been developed to satisfy demands for miniaturization and high capacity. Recently, various techniques for stacked semiconductor packages capable of satisfying the demands toward miniaturization, high capacity and mounting efficiency have been developed. The term "stacking" as used in the semiconductor industry means to vertically place at least two semiconductor chips or packages. In the case of a memory device, it is possible with the stacking technology to realize a product having a larger memory capacity than obtainable through a semiconductor integration process as well as to increase efficiency in usage of the mounting area.

As an example of a stacked semiconductor package, a structure using through-silicon vias (hereinafter referred to as "through-electrodes") has been suggested. The stacked semiconductor package using the through-electrodes provides advantages in that since an electrical connection between the semiconductor chips is made through the through-electrodes, it is possible to realize a semiconductor device with improved operation speed and with a miniaturized size.

However, the semiconductor chips stacked using the through-electrodes are venerable to physical impact and thus defects such as damage of the semiconductor chip are frequently occurred in a process of packaging the stacked semiconductor chips.

BRIEF SUMMARY

Various embodiments are generally directed to a semiconductor device which can prevent damage of semiconductor chips stacked using through-electrodes and improve heat dissipating property of the same.

In an embodiment, a semiconductor device includes a chip stack structure having a plurality of semiconductor chips, the semiconductor chips being stacked such that they are electrically connected using through-electrodes; and a support frame attached to a side surface of the chip stack structure.

The semiconductor chips may include first semiconductor chips, first semiconductor chips having their respective through-electrodes and being stacked such that their respective through-electrodes are connected. The semiconductor chips may further comprise a second semiconductor chip staked over an uppermost first semiconductor chip which is disposed at the uppermost among the first semiconductor chips and having bonding pads electrically connected with the through-electrodes of the uppermost first semiconductor chip.

The support frame includes a thermal transfer material. For example, the thermal transfer material comprises any one of copper, aluminum, silver, gold and an alloy thereof.

The semiconductor device may further include an adhesive member formed between the side surface of the chip stack structure and the support frame such that the chip stack structure and the support frame are attached to each other. The adhesive member may comprise a thermal interface material.

The support frame may have a flat plate-like shape and be attached to two opposing side surfaces of the chip stack structure. For example, the support frame may be attached to two side surfaces of the chip stack structure parallel to the major axis direction of the semiconductor chip or to two side surfaces of the chip stack structure parallel to the minor axis direction of the semiconductor chip.

Alternatively, the support frame may substantially have a "["-like shape when viewed from the top such that it surrounds the side surfaces at both ends of the chip stack structure, a shape of rectangular frame that surrounds all of the side surfaces of the chip stack structure or a cap-like shape that surrounds the side surfaces of the chip stack structure and covers the upper surface of the chip stack structure.

The semiconductor device may further include a structural body having connection electrodes electrically connected with the through-electrodes of a lowermost first semiconductor chip which is disposed at the lowermost among the first semiconductor chips. The structural body may comprise a printed circuit board, a semiconductor package and an interposer.

The semiconductor device may further include a first dielectric layer formed in the lower surface of the lowermost first semiconductor chip of the first semiconductor chips in such a way as to expose the through-electrodes of the lowermost first semiconductor chip; redistribution lines formed over the first dielectric layer such that they are electrically connected with the respective through-electrodes of the lowermost first semiconductor chip; and a second dielectric layer formed over the first dielectric layer including the redistribution lines in such a way as to expose some portion of the respective redistribution lines. In addition, the semiconductor device may further comprise: external connection terminals respectively mounted over the portions of the redistribution lines exposed by the second dielectric layer.

In an embodiment, a mobile phone including a semiconductor device, the semiconductor device including a chip stack structure having a plurality of semiconductor chips, the semiconductor chips being stacked such that they are electrically connected using through-electrodes, and a support frame attached to a side surface of the chip stack structure.

In an embodiment, an electronic system including a memory and a controller, the memory and controller including a chip stack structure having a plurality of semiconductor chips, the semiconductor chips being stacked such that they are electrically connected using through-electrodes, and a support frame attached to a side surface of the chip stack structure.

DESCRIPTION OF SPECIFIC EMBODIMENTS

Hereafter, various embodiments of the present invention will be described in detail with reference to the accompanying drawings.

Figure 1:
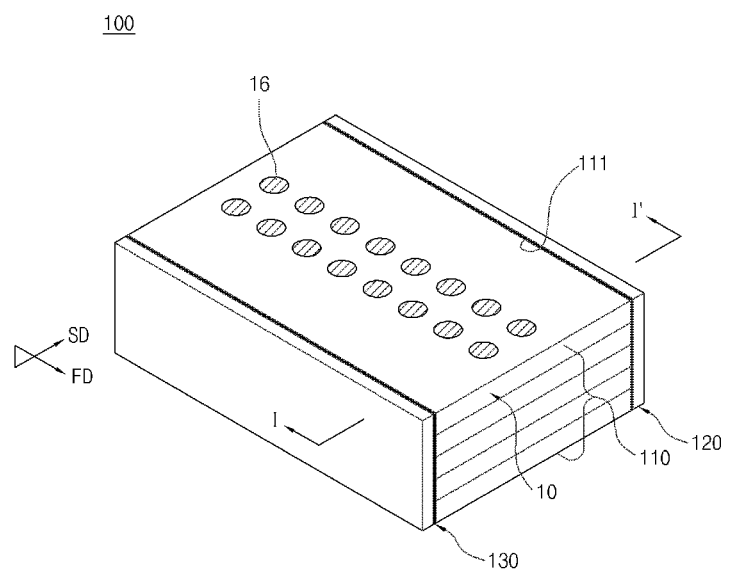
FIG. 1 is a perspective view illustrating a semiconductor device in accordance with the first embodiments.
Figure 2:
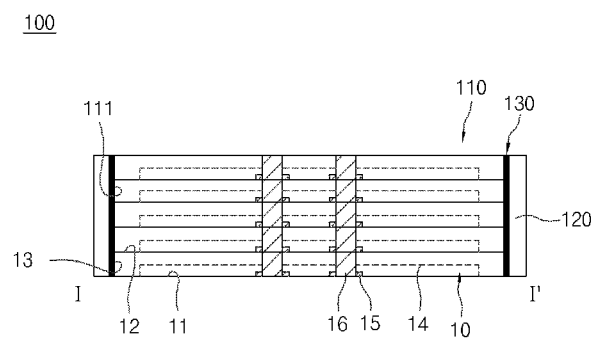
FIG. 2 is a cross-sectional view taken along a line I-I' of FIG. 1.

FIG. 1 is a perspective view illustrating a semiconductor device in accordance with the first embodiments and FIG. 2 is a cross-sectional view taken along a line I-I' of FIG. 1.

Referring to FIGS. 1 and 2, a semiconductor device 100 in accordance with the first embodiments may include a chip stack structure 110 and support frames 120. The semiconductor device 100 may further include an adhesive member 130.

In the present embodiment, the chip stack structure 110 includes a plurality of first semiconductor chips 10.

Each of the first semiconductor chips 10 may substantially have a rectangular hexahedral shape. The rectangular hexahedral shaped first semiconductor chip 10 may have a first surface 11, a second surface 12 and four side surfaces 13. The first surface 11 may be opposite to the second surface 12 and the four side surfaces 13 may connect the first surface 11 and the second surface 12.

Each of the first semiconductor chips 10 has a circuit unit 14, bonding pads 15 and through-electrodes 16. The circuit unit 14 may have a data storage section for storing data and a data processing section for processing the data, and may consist of semiconductor elements, e.g. transistors, capacitors, fuses and the like, that are required for the operation of the chip. The bonding pads 15 may serve as electrical contacts of the circuit unit 14 for electrical connection with the outside, and are formed in the first surface 11 of the first semiconductor chip 10. In the present embodiments, the bonding pads 15 may be formed in the center of the first surface 11 of the first semiconductor chip 10 substantially along a major axis direction FD of the first semiconductor chip 10. In other words, the first semiconductor chip 10 may be a center pad type. The through-electrodes 16 may pass through the first surface 11 and the second surface 12, and may be electrically connected with the bonding pads 15. In the present embodiments, the through-electrodes 16 may pass through the bonding pads 15 and may be directly connected with the bonding pads 15. Alternatively, while not shown, the through-electrodes 16 may not pass through the bonding pads 15 and in this case, the through-electrodes 16 may be connected with the bonding pads 15 through the circuit unit 14.

The plurality of the first semiconductor chips 10 may be vertically stacked such that their respective through-electrodes 16 may be connected, to thereby form the chip stack structure 110. The chip stack structure 110 may have four side surfaces 111 that correspond to the side surfaces 13 of the first semiconductor chips 10.

The support frames 120 may be attached to the side surfaces 111 of the chip stack structure 110 in such a way as to connect the stacked first semiconductor chips 10. In the present embodiments, the support frame 120 may have a thin flat plate-like shape and is attached to two side surfaces 111 of the chip stack structure 110 substantially parallel to the major axis direction FD of the first semiconductor chips 10. The support frame 120 may include a thermal transfer material, e.g. any one of copper, aluminum, silver, gold and an alloy thereof.

The adhesive member 130 may be formed between the chip stack structure 110 and the support frame 120 such that the chip stack structure 110 and the support frame 120 may be attached to each other. The adhesive member 130 may include a thermal interface material (TIM).

According to the present embodiments, strong support of the stacked semiconductor chips by the support frames prevents damage of the semiconductor chips in the process of handling the chip stack structure. Therefore, it is possible to avoid the usage of a carrier substrate which has conventionally been used in the process of handling a chip stack structure, and thus to fundamentally prevent damage of a semiconductor chip occurred in the process of bonding and debonding of the carrier substrate. In addition, rapid dissipation of heat generated in the semiconductor chips through the support frames made of a TIM to the outside contributes to improved heat dissipating property of the semiconductor device. Furthermore, the semiconductor device in accordance with the present embodiments is advantageous in miniaturization since thin support frames which do not substantially increase the size of a semiconductor device are attached to the side surfaces of the chip stack structure.

The present invention is not limited by the first embodiments as described above and may be modified to various forms. Some modified forms of the semiconductor device in accordance with the present invention will become apparent from the following description with reference to FIGS. 3 to 9.

Figure 3:
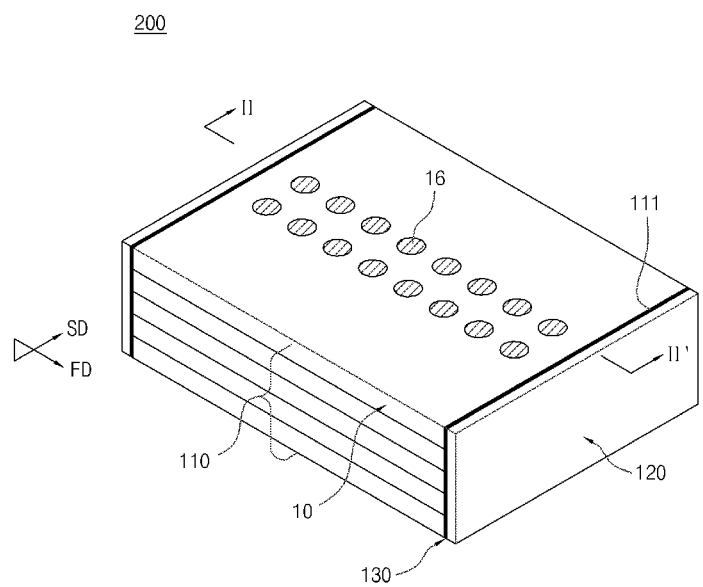
FIG. 3 is a perspective view illustrating a semiconductor device in accordance with the second embodiments.
Figure 4:
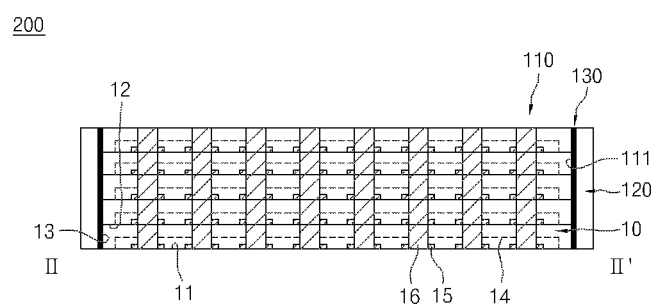
FIG. 4 is a cross-sectional view taken along a line II-II' of FIG. 3.

FIG. 3 is a perspective view illustrating a semiconductor device in accordance with the second embodiments and FIG. 4 is a cross-sectional view taken along a line II-II' of FIG. 3.

A semiconductor device 200 in accordance with the second embodiments have a structure in that a position of the support frame 120 is changed when compared to the first embodiments as described above with reference to FIGS. 1 and 2. In other words, the semiconductor device 200 in accordance with the second embodiments may be substantially the same as the semiconductor device 100 in accordance with the first embodiments, except for the support frame 120. Therefore, repeated description for the same component parts will be omitted herein, and the same technical terms and the same reference numerals will be used to refer to the same component parts.

Referring to FIGS. 3 and 4, the support frame 120 of the semiconductor device 200 in accordance with the second embodiments may have a flat plate-like shape and may be attached to two side surfaces 111 of the chip stack structure 110 substantially parallel to the minor axis direction SD of the first semiconductor chips 10.

Figure 5:
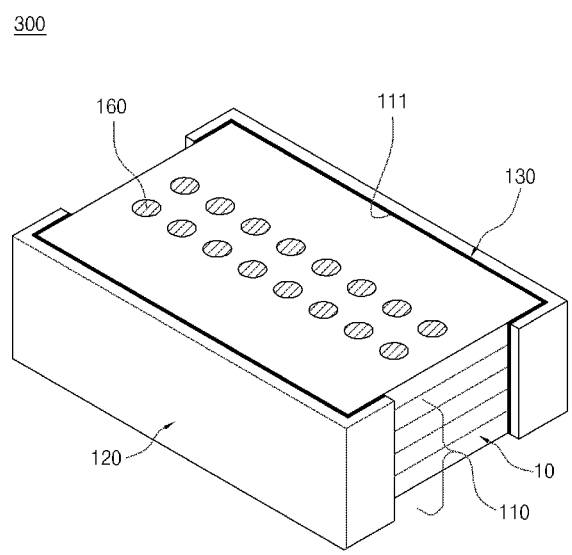
FIG. 5 is a perspective view illustrating a semiconductor device in accordance with the third embodiments.
Figure 6:
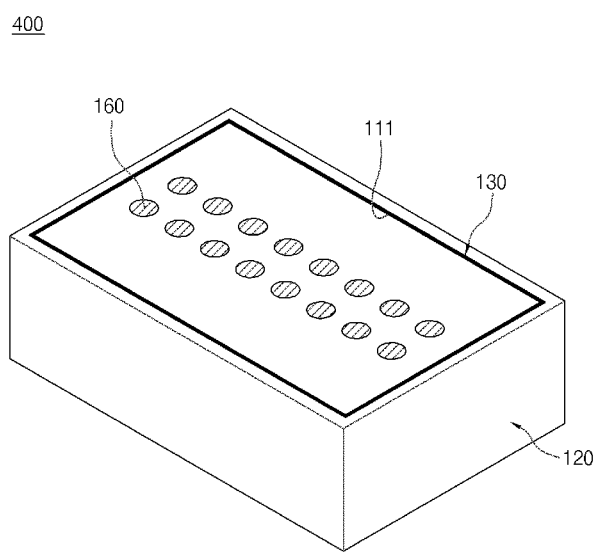
FIG. 6 is a perspective view illustrating a semiconductor device in accordance with the fourth embodiments.

FIG. 5 is a perspective view illustrating a semiconductor device in accordance with the third embodiments and FIG. 6 is a perspective view illustrating a semiconductor device in accordance with the fourth embodiments.

Semiconductor devices 300 and 400 in accordance with the third and forth embodiments respectively have a structure in that the shape of the support frame 120 is changed when compared to the first embodiments as described above with reference to FIGS. 1 and 2. In other words, the devices 300 and 400 in accordance with the third and forth embodiments are substantially the same as the semiconductor device 100 in accordance with the first embodiments, except for the support frame 120. Therefore, repeated description for the same component parts will be omitted herein, and the same technical terms and the same reference numerals will be used to refer to the same component parts.

Referring to FIG. 5, the support frame 120 may substantially have a "["-like shape so that it surrounds the side surfaces at both ends of the chip stack structure 110. In other words, the support frame 120 may fully cover two opposing sides of the chip stack structure 110 along with the corners, and may partially cover the other two opposing sides of the chip stack structure. Otherwise, referring to FIG. 6, the support frame 120 may be a rectangular frame that surrounds all of the side surfaces 111 of the chip stack structure 110.

According to the embodiments shown in FIGS. 5 and 6, increased attachment area between the chip stack structure 110 and the support frames 120 provides stronger support of the semiconductor chips 10 of the chip stack structure 110 by the support frame 120. Furthermore, rapid heat dissipation of heat generated in the first semiconductor chips 10 of the chip stack structure 110 through the support frames 120 contributes to a more improved heat dissipating property.

Figure 7:
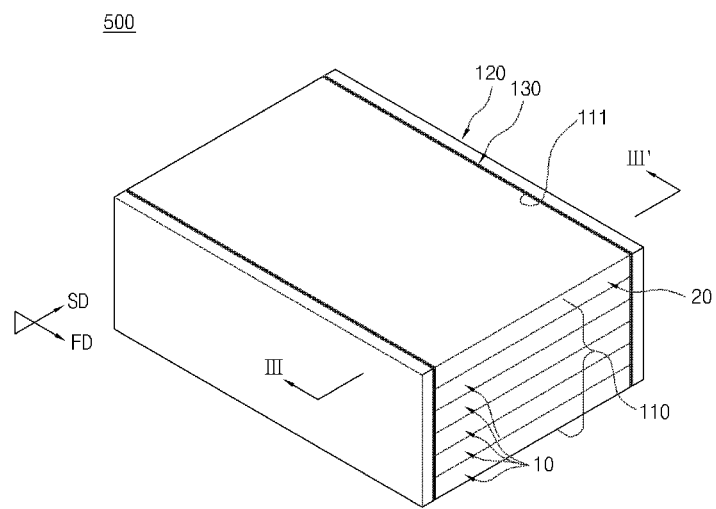
FIG. 7 is a perspective view illustrating a semiconductor device in accordance with the fifth embodiments.
Figure 8:
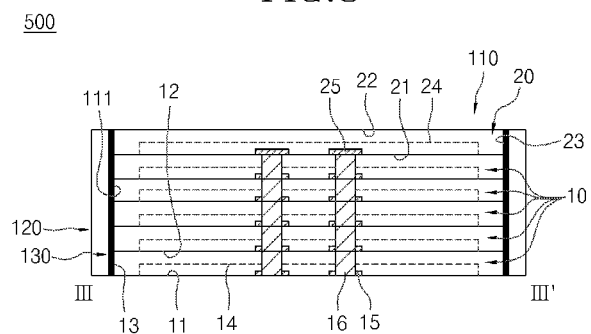
FIG. 8 is a cross-sectional view taken along a line III-III' of FIG. 7.

FIG. 7 is a perspective view illustrating a semiconductor device in accordance with the fifth embodiments and FIG. 8 is a cross-sectional view taken along a line III-III' of FIG. 7.

A semiconductor device 500 in accordance with the fifth embodiments has a structure in that the chip stack structure 110 further includes a second semiconductor chip 20 when compared to the first embodiments as described above with reference to FIGS. 1 and 2. In other words, the semiconductor devices 500 in accordance with the fifth embodiments are substantially the same as the semiconductor device 100 in accordance with the first embodiments, except for the chip stack structure 110. Therefore, repeated description for the same component parts will be omitted herein, and the same technical terms and the same reference numerals will be used to refer to the same component parts.

Referring to FIGS. 7 and 8, the chip stack structure 110 in the present embodiment includes a plurality of first semiconductor chips 10 and a second semiconductor chip 20.

The second semiconductor chip 20 may be placed over an uppermost first semiconductor chip 10 which may be disposed at the lowermost among the stacked first semiconductor chips 10 such that the plurality of the first semiconductor chips 10 and the second semiconductor chip 20 form together the chip stack structure 110.

The second semiconductor chip 20 may substantially have a rectangular hexahedral shape. The rectangular hexahedral shaped second semiconductor chip 20 may have a first surface 21 which faces the uppermost first semiconductor chip 10, a second surface 22 which may be opposite to the first surface 21 and four side surfaces 23 which connect the first and second surfaces 21 and 22.

The second semiconductor chip 20 may have a circuit unit 24 and bonding pads 25. The circuit unit 24 may have a data storage section for storing data and a data processing section for processing the data, and may consist of semiconductor elements, e.g. transistors, capacitors, fuses and the like, that are required for the operation of the chip. The bonding pads 25 may be formed in the first surface 21 of the second semiconductor chip 20 and each of them may be electrically connected with the respective through-electrodes 16 of the uppermost first semiconductor chip 10.

The chip stack structure 110 has four side surfaces 111 that correspond to the side surfaces 13 of the first semiconductor chips 10 and the side surfaces 23 of the second semiconductor chip 20.

The support frames 120 may be attached to the side surfaces 111 of the chip stack structure 110 in such a way as to connect the first semiconductor chips 10 and second semiconductor chip 20. In the present embodiment, the support frame 120 may have a thin flat plate-like shape and may be attached to two side surfaces 111 of the chip stack structure 110 substantially parallel to the major axis direction FD of the first semiconductor chips 10 and second semiconductor chip 20.

Figure 9:
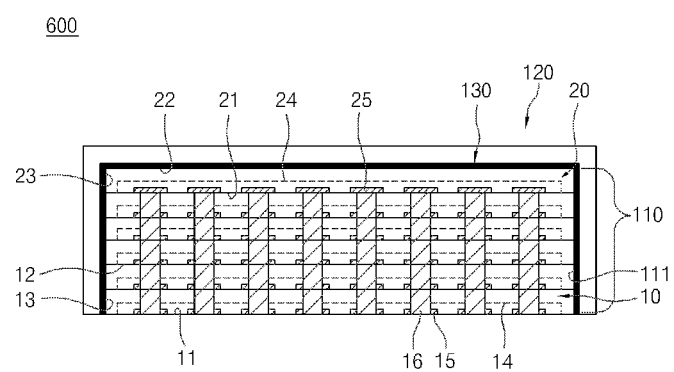
FIG. 9 is a cross-sectional view illustrating a semiconductor device in accordance with the sixth embodiments.

FIG. 9 is a cross-sectional view illustrating a semiconductor device in accordance with the sixth embodiments.

A semiconductor device 600 in accordance with the sixth embodiments have a structure in that the shape of the support frame 120 is changed when compared to the fifth embodiments as described above with reference to FIGS. 7 and 8. In other words, the semiconductor device 600 in accordance with the second embodiments is substantially the same as the semiconductor device 500 in accordance with the fifth embodiments, except for the support frame 120. Therefore, repeated description for the same component parts will be omitted herein, and the same technical terms and the same reference numerals will be used to refer to the same component parts.

Referring to FIG. 9, the support frame 120 may substantially have a cap-like shape that surrounds the side surfaces 111 of the chip stack structure 110 and substantially covers or covers the upper surface of the chip stack structure 110.

According to the embodiment shown in FIG. 9, increased attachment area between the chip stack structure 110 and the support frame 120 provides stronger support of the first semiconductor chips 10 and second semiconductor chip 20 of the chip stack structure 110 by the support frame 120. Furthermore, rapid heat dissipation of heat generated in the first semiconductor chips 10 and second semiconductor chip 20 of the chip stack structure 110 through the support frame 120 contributes to more improved heat dissipating property.

Figure 10:
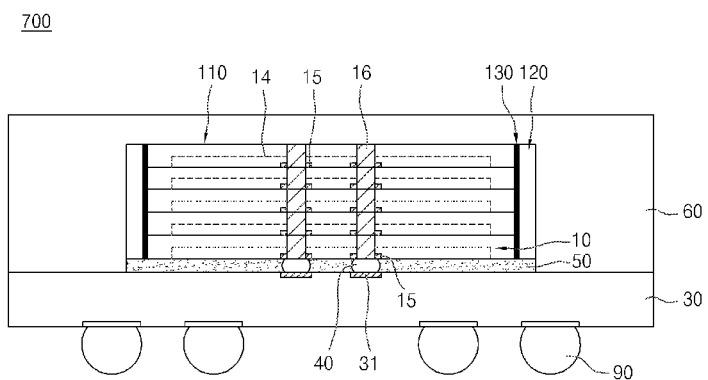
FIG. 10 is a cross-sectional view illustrating a semiconductor device in accordance with the seventh embodiments.

FIG. 10 is a cross-sectional view illustrating a semiconductor device in accordance with the seventh embodiments.

A semiconductor device 700 in accordance with the seventh embodiments may have a structure in that a structural body 30, conductive connection members 40, an adhesive member 50 and a molding section 60 are further provided in addition to the components of the first embodiment as described above with reference to FIGS. 1 and 2. In other words, the semiconductor device 700 in accordance with the seventh embodiments are substantially the same as the semiconductor device 100 in accordance with the first embodiments, except for the structural body 30, the conductive connection members 40, the adhesive member 50 and the molding section 60. Therefore, repeated description for the same component parts will be omitted herein, and the same technical terms and the same reference numerals will be used to refer to the same component parts.

Referring to FIG. 10, the chip stack structure 110 may be mounted on the structural body 30 such that the through-electrodes 16 of a lowermost first semiconductor chip 10 which is disposed at the lowermost among the first semiconductor chips 10 of the chip stack structure 110 are electrically connected with the connection electrodes 31 of the structural body 30. In the present embodiment, the structural body 30 may consist of a printed circuit board (PCB).

The conductive connection member 40 may be formed between the through-electrode 16 of the lowermost first semiconductor chip 10 and the connection electrode 31 of the structural body 30 such that the through-electrode 16 of the lowermost first semiconductor chip 10 of the chip stack structure 110 and the connection electrode 31 of the structural body 30 are electrically connected. The adhesive member 50 may be formed between the chip stack structure 110 and the structural body 30 such that the chip stack structure 110 and the structural body 30 are attached to each other. The conductive connection member may be formed of a metal including one or more of copper, tin and silver, and the adhesive member 50 may include any one of non-conductive film (NCF), non-conductive paste (NCP) and polymer.

The molding section 60 may substantially cover or cover the upper surface of the structural body 30 including the chip stack structure 110 and the support frames 120.

Although the structural body 30 is a PCB in the case of the embodiment shown in FIG. 10, the structural body 30 may be a semiconductor package or an interposer. Additionally, the structural body 30 may include external connection terminals 90.

Figure 11:
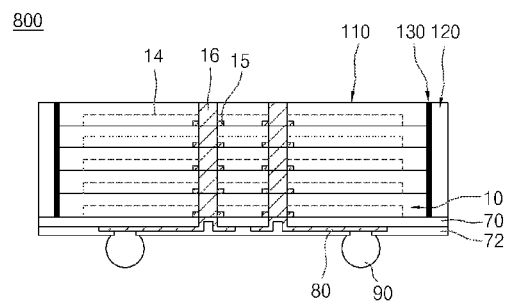
FIG. 11 is a cross-sectional view illustrating a semiconductor device in accordance with the eighth embodiments.

FIG. 11 is a cross-sectional view illustrating a semiconductor device in accordance with the eighth embodiments.

A semiconductor device 800 in accordance with the eighth embodiments may have a structure in that first and second dielectric layers 70 and 72, redistribution lines 80 and external connection terminals 90 are further provided in addition to the components of the first embodiments as described above with reference to FIGS. 1 and 2. In other words, the semiconductor device 800 in accordance with the eighth embodiments are substantially the same as the semiconductor device 100 in accordance with the first embodiments, except for the first and second dielectric layers 70 and 72, the redistribution lines 80 and the external connection terminals 90. Therefore, repeated description for the same component parts will be omitted herein, and the same technical terms and the same reference numerals will be used to refer to the same component parts.

Referring to FIG. 11, the first dielectric layer 70 may be formed on the lower surface of the lowermost first semiconductor chip 10 of the chip stack structure 110 in such a way as to expose the through-electrodes 16 of the lowermost first semiconductor chip 10. The redistribution lines 80 may be formed under the first dielectric layer 70 such that they are electrically connected with the respective through-electrodes 16 of the lowermost first semiconductor chip 10. The second dielectric layer 72 may be formed under the first dielectric layer 70 including the redistribution lines 80 in such a way as to expose some portion of the respective redistribution lines 80. The external connection terminal 90 may be mounted under the portion of the redistribution line 80 exposed by the second dielectric layer 72.

Although the embodiments as described above with reference to FIGS. 10 and 11 are described and illustrated as including the components of the first embodiments as described with reference to FIGS. 1 and 2, the present invention is not limited thereto and, instead of the components of the first embodiments as described with reference to FIGS. 1 and 2, may include the components of any one of the second to sixth embodiments as described with reference to FIGS. 3 to 7.

The semiconductor device in accordance with the various embodiments may be applied to a variety of electronic apparatuses.

Figure 12:
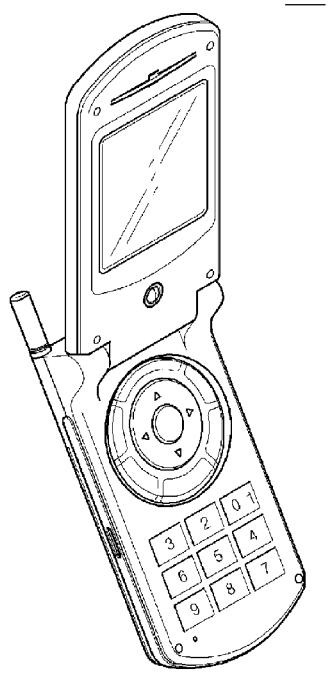
FIG. 12 is a perspective view illustrating an electronic apparatus having the semiconductor device in accordance with the various embodiments.

FIG. 12 is a perspective view illustrating an electronic apparatus having the semiconductor device in accordance with the various embodiments.

Referring to FIG. 12, the semiconductor device in accordance with the various embodiments may be applied to an electronic apparatus 1000 such as a mobile phone. The semiconductor device in accordance with the various embodiments is advantageous to improve reliability of the electronic apparatus 1000 and manufacture a light weight, slim, compact and miniaturized electronic apparatus 1000 since it can prevent damage of the semiconductor chip and realize improved heat dissipation property and miniaturized size. The electronic apparatus 1000 is not limited to the mobile phone shown in FIG. 12, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 13:
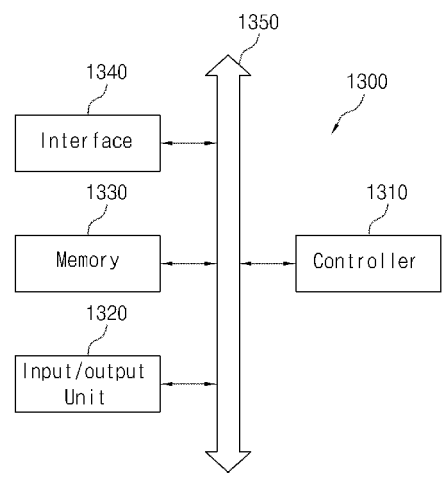
FIG. 13 is a system block diagram showing an electronic system to which the semiconductor device in accordance with various embodiments is applied.

FIG. 13 is a block diagram showing, for example, an electronic apparatus which may include the semiconductor device according to the various embodiments.

Referring to FIG. 13, an electronic system 1300 may include a controller 1310, an input/output unit 1320, and a memory 1330. The controller 1310, the input/output unit 1320 and the memory 1330 may be coupled with one another through a bus 1350. The bus 1350 serves as a path through which data move. For example, the controller 1310 may include at least any one of at least one microprocessor, at least one digital signal processor, at least one microcontroller, and logic devices capable of performing the same functions as these components. The controller 1310 and the memory 1330 may include the semiconductor device according to the embodiments of the present invention. The input/output unit 1320 may include at least one selected among a keypad, a keyboard, a display device, and so forth. The memory 1330 is a device for storing data. The memory 1330 may store data and/or commands to be executed by the controller 1310, and the likes. The memory 1330 may include a volatile memory device and/or a nonvolatile memory device. Otherwise, the memory 1330 may be constituted by a flash memory. For example, a flash memory to which the technology of the present invention is applied may be mounted to an information processing system such as a mobile terminal or a desk top computer. The flash memory may be constituted by a solid state drive (SSD). In this case, the electronic system 1300 may stably store a large amount of data in a flash memory system. The electronic system 1300 may further include an interface 1340 configured to transmit and receive data to and from a communication network. The interface 1340 may be a wired or wireless type. For example, the interface 1340 may include an antenna or a wired or wireless transceiver. Further, while not shown, a person skilled in the art will readily appreciate that the electronic system 1300 may be additionally provided with an application chipset, a camera image processor (CIP), an input/output unit, etc.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor device comprising:
a chip stack structure having a plurality of semiconductor chips, the semiconductor chips being stacked such that they are electrically connected using through-electrodes; and
a support frame attached to a side surface of the chip stack structure,
wherein the support frame substantially has a "["-like shape that it surrounds the side surfaces at both ends of the chip stack structure.

2. The semiconductor device according to claim 1, wherein the semiconductor chips comprise first semiconductor chips, first semiconductor chips having their respective through-electrodes and being stacked such that their respective through-electrodes are connected.

3. The semiconductor device according to claim 2, wherein the semiconductor chips further comprise a second semiconductor chip stacked over an uppermost first semiconductor chip which is disposed at the uppermost among the first semiconductor chips and having bonding pads electrically connected with the through-electrodes of the uppermost first semiconductor chip.

4. The semiconductor device according to claim 2, further comprising:
a structural body having connection electrodes electrically connected with the through-electrodes of a lowermost first semiconductor chip which is disposed at the lowermost among the first semiconductor chips.

5. The semiconductor device according to claim 4, wherein the structural body comprises a printed circuit board, a semiconductor package and an interposer.

6. The semiconductor device according to claim 2, further comprising:
a first dielectric layer formed on a lower surface of a lowermost first semiconductor chip of the first semiconductor chips in such a way as to expose the through-electrodes of the lowermost first semiconductor chip;
redistribution lines formed under the first dielectric layer such that they are electrically connected with the respective through-electrodes of the lowermost first semiconductor chip; and
a second dielectric layer formed under the first dielectric layer including the redistribution lines in such a way as to expose some portion of the respective redistribution lines.

7. The semiconductor device according to claim 6, further comprising:
external connection terminals respectively mounted under the portions of the redistribution lines exposed by the second dielectric layer.

8. The semiconductor package according to claim 1, wherein the support frame comprises a thermal transfer material.

9. The semiconductor device according to claim 8, wherein the thermal transfer material comprises any one of copper, aluminum, silver, gold and an alloy thereof.

10. The semiconductor device according to claim 1, further comprising:
an adhesive member formed between the side surface of the chip stack structure and the support frame such that the chip stack structure and the support frame are attached to each other.

11. The semiconductor device according to claim 10, wherein the adhesive member comprise a thermal interface material.

12. The semiconductor device according to claim 1, wherein the support frame fully covers two opposing sides of the chip stack structure, and partially covers two other opposing sides of the chip stack structure.

13. A mobile phone including a semiconductor device, the semiconductor device comprising:
a chip stack structure having a plurality of semiconductor chips, the semiconductor chips being stacked such that they are electrically connected using through-electrodes; and
a support frame attached to a side surface of the chip stack structure,
wherein the support frame substantially has a "["-like shape such that it surrounds the side surfaces at both ends of the chip stack structure.

14. An electronic system including a memory and a controller, the memory and controller comprising:
a chip stack structure having a plurality of semiconductor chips, the semiconductor chips being stacked such that they are electrically connected using through-electrodes; and
a support frame attached to a side surface of the chip stack structure,
wherein the support frame substantially has a "["-like shape such that it surrounds the side surfaces at both ends of the chip stack structure.

* * * * *